(12) United States Patent
Park et al.

(10) Patent No.: US 10,164,602 B2
(45) Date of Patent: Dec. 25, 2018

(54) ACOUSTIC WAVE DEVICE AND METHOD OF MANUFACTURING THE SAME

(71) Applicant: Samsung Electro-Mechanics Co., Ltd., Suwon-si (KR)

(72) Inventors: Seung Wook Park, Suwon-si (KR); Christian Romero, Suwon-si (KR); Seong Hun Na, Suwon-si (KR); Tae Sung Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 146 days.

(21) Appl. No.: 15/190,286

(22) Filed: Jun. 23, 2016

(65) Prior Publication Data

US 2017/0077900 A1 Mar. 16, 2017

(30) Foreign Application Priority Data

Sep. 14, 2015 (KR) .................. 10-2015-0129835
Mar. 16, 2016 (KR) .................. 10-2016-0031352

(51) Int. Cl.
*H03H 9/10* (2006.01)
*H03H 3/02* (2006.01)
(Continued)

(52) U.S. Cl.
CPC ............ *H03H 9/105* (2013.01); *H01L 41/23* (2013.01); *H03H 3/02* (2013.01); *H03H 3/08* (2013.01);
(Continued)

(58) Field of Classification Search
CPC .... H03H 9/706; H03H 9/725; H03H 9/02913; H03H 9/02992; H03H 9/0504;
(Continued)

(56) References Cited

U.S. PATENT DOCUMENTS 5,382,929 A * 1/1995 Inao .................. H03H 9/02133
310/344
5,875,099 A * 2/1999 Maesaka .............. H03H 9/1014
310/344

(Continued)

FOREIGN PATENT DOCUMENTS

JP 7-202152 A 8/1995
JP 2987455 B2 10/1999
(Continued)

OTHER PUBLICATIONS

English language machine translation of JP 2003-037471 A, published Feb. 7, 2003, 13 pages.*
(Continued)

*Primary Examiner* — Barbara Summons
(74) *Attorney, Agent, or Firm* — NSIP Law

(57) ABSTRACT

An acoustic wave device includes a substrate comprising one surface on which an acoustic wave generator and at least one ground pad are included; a support component formed of an insulating material and disposed on the substrate along a circumference of the acoustic wave generator; and a shielding member electrically connected to the ground pad and blocking reception or emission of electromagnetic waves at the acoustic wave generator.

16 Claims, 15 Drawing Sheets

(51) Int. Cl.
  H03H 3/08 (2006.01)
  H03H 9/70 (2006.01)
  H01L 41/23 (2013.01)
  H03H 9/72 (2006.01)
  H03H 9/02 (2006.01)
  H03H 9/05 (2006.01)

(52) U.S. Cl.
  CPC .... *H03H 9/02913* (2013.01); *H03H 9/02992* (2013.01); *H03H 9/0504* (2013.01); *H03H 9/059* (2013.01); *H03H 9/1014* (2013.01); *H03H 9/1071* (2013.01); *H03H 9/1078* (2013.01); *H03H 9/1092* (2013.01); *H03H 9/706* (2013.01); *H03H 9/725* (2013.01); *H01L 2224/16225* (2013.01); *H01L 2924/15311* (2013.01); *H01L 2924/181* (2013.01); *H01L 2924/19105* (2013.01)

(58) Field of Classification Search
  CPC .... H03H 9/059; H03H 9/1014; H03H 9/1071; H03H 3/02; H03H 3/03; H03H 9/105; H03H 9/1092; H03H 9/1078; H01L 41/23
  USPC ..... 333/133, 187, 189, 193–196; 310/313 R, 310/313 B, 313 D
  See application file for complete search history.

(56) References Cited

U.S. PATENT DOCUMENTS

| | | | |
|---|---|---|---|
| 6,573,635 B2 | 6/2003 | Suga et al. | |
| 6,777,767 B2 | 8/2004 | Badehi | |
| 7,972,884 B2 | 7/2011 | Obata et al. | |
| 2001/0010444 A1* | 8/2001 | Pahl | H03H 9/02913 310/344 |
| 2004/0125970 A1* | 7/2004 | Kawakubo | H03H 3/02 381/190 |
| 2006/0043513 A1 | 3/2006 | Kim | |
| 2009/0224851 A1* | 9/2009 | Feiertag | H03H 9/059 333/186 |
| 2010/0225202 A1* | 9/2010 | Fukano | H03H 9/059 310/313 C |
| 2011/0084573 A1* | 4/2011 | Yamaji | H03H 9/1092 310/340 |
| 2012/0223789 A1* | 9/2012 | Inoue | H01L 41/053 333/193 |
| 2017/0063335 A1* | 3/2017 | Park | H04B 11/00 |

FOREIGN PATENT DOCUMENTS

| | | | |
|---|---|---|---|
| JP | 2002-76154 A | | 3/2002 |
| JP | 2003-037471 A | * | 2/2003 |
| JP | 2007-324162 A | | 12/2007 |
| JP | 2010-252164 A | | 11/2010 |
| KR | 2002-0053662 A | | 7/2002 |
| KR | 10-2007-0041572 A | | 4/2007 |
| KR | 10-2011-0036978 A | | 4/2011 |
| KR | 10-2013-0042171 A | | 4/2013 |
| KR | 10-2013-0076287 A | | 7/2013 |

OTHER PUBLICATIONS

English language machine translation of JP 2007-324162 A, published Dec. 13, 2007, 6 pages.*

* cited by examiner

ACOUSTIC WAVE DEVICE AND METHOD OF MANUFACTURING THE SAME

CROSS-REFERENCE TO RELATED APPLICATION

This application claims the priority and benefit of Korean Patent Application No. 10-2015-0129835 filed on Sep. 14, 2015, and 10-2016-0031352 filed on Mar. 16, 2016, with the Korean Intellectual Property Office, the disclosure of which is incorporated herein by reference.

BACKGROUND

1. Field

The present disclosure relates to an acoustic wave device and a method of manufacturing the same.

2. Description of Related Art

A band pass filter is a core component of communications devices that passes signals only in a certain frequency band among various frequencies to transmit and receive the selected signals.

Representative examples of the band pass filter include a surface acoustic wave (SAW) filter, a bulk acoustic wave (BAW) filter, and the like.

Generally, in an acoustic wave device, a thin film type device that generates resonance by depositing a piezoelectric dielectric material on a silicon wafer, a semiconductor substrate, and using piezoelectric characteristics thereof is implemented as a filter.

The acoustic wave device has been used in mobile communications devices, small and lightweight filters included in chemical and biological apparatuses, oscillators, resonance elements, acoustic resonance mass sensors, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the present disclosure, an acoustic wave device may include: a substrate comprising one surface on which an acoustic wave generator and at least one ground pad are included; a support component formed of an insulating material and disposed on the substrate along a circumference of the acoustic wave generator; and a shielding member electrically connected to the ground pad and blocking reception or emission of electromagnetic waves at the acoustic wave generator.

According to another aspect of the present disclosure, a method of manufacturing an acoustic wave device may include: preparing a substrate comprising one surface on which an acoustic wave generator and at least one ground pad are included; and forming a shielding member enclosing the acoustic wave generator on the substrate.

BRIEF DESCRIPTION OF DRAWINGS

These and/or other aspects will become apparent and more readily appreciated from the following description of the embodiments, taken in conjunction with the accompanying drawings in which.

Figure 1:
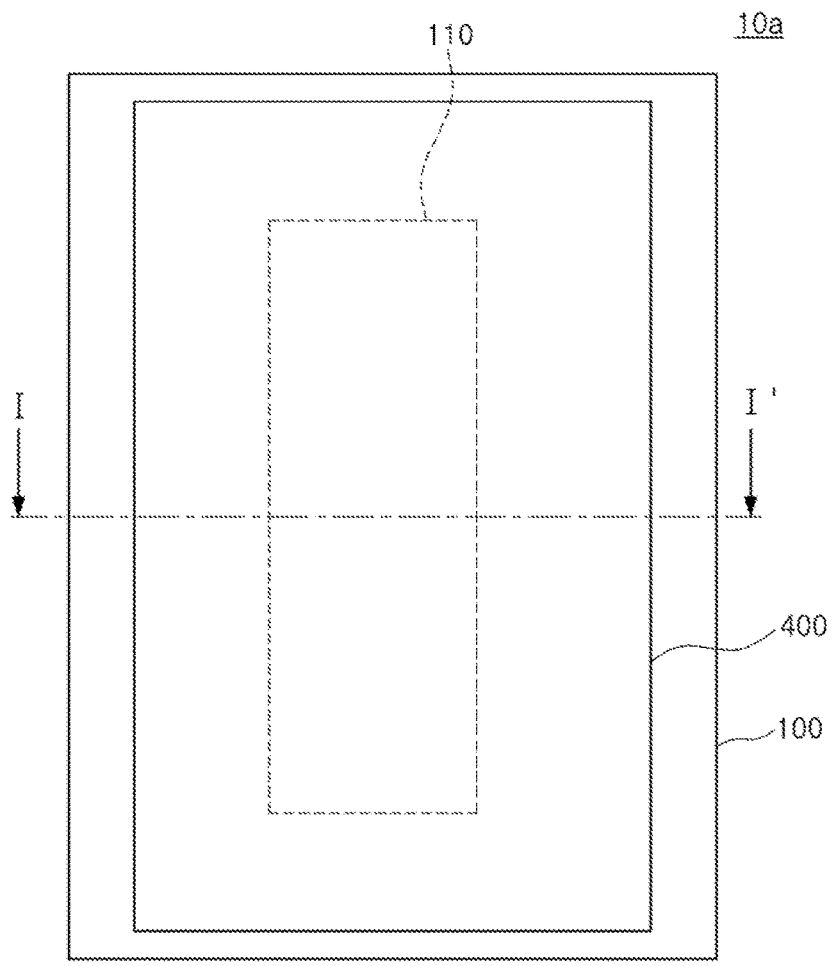
FIG. 1 is a plan view schematically illustrating an acoustic wave device according to an exemplary embodiment in the present disclosure.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, reference will now be made in detail to examples with reference to the accompanying drawings, wherein like reference numerals refer to like elements throughout.

Various alterations and modifications may be made to the examples. Here, the examples are not construed as limited to the disclosure and should be understood to include all changes, equivalents, and replacements within the idea and the technical scope of the disclosure.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing various embodiments only and is not intended to limit any or all of the embodiments. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Figure 2:
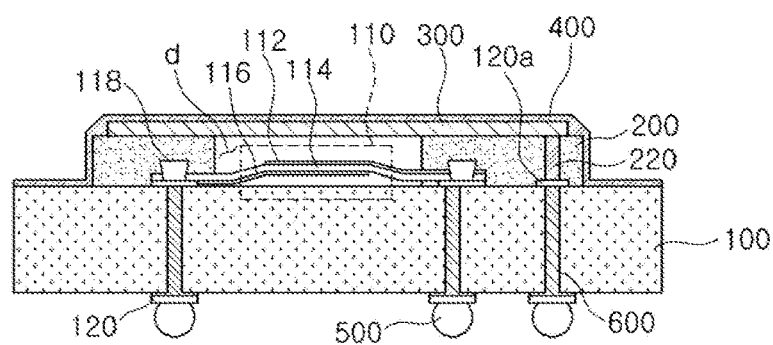
FIG. 2 is a cross-sectional view taken along line I-I' of FIG. 1.

FIG. 1 is a plan view schematically illustrating an acoustic wave device according to an exemplary embodiment in the present disclosure, and FIG. 2 is a cross-sectional view taken along line I-I' of FIG. 1.

Referring to FIGS. 1 and 2, an acoustic wave device 10a, according to an exemplary embodiment, includes a substrate 100, a support component 200, a protective member 300, and a sealing component 400. In this example, the acoustic wave device 10a may include a filter element passing a wave within an approved frequency band such as a surface acoustic wave (SAW) filter, a bulk acoustic wave (BAW) filter, a duplexer, and the like.

In an example in which a SAW filter is used to implement the acoustic wave device 10a, a piezoelectric substrate may be used as the substrate 100. In an example in which a BAW filter is used to implement the acoustic wave device 10a, a Si substrate may be used as the substrate 100.

For example, the substrate 100 may be formed of a single crystal such as $LiTaO_3$, $LiNbO_3$, $Li_2B_4O_7$, $SiO_2$, silicon, or the like. In addition, a lead zirconate titanate (PZT) based polycrystalline substrate or a ZnO thin film may be used.

However, the substrate 100 used in the acoustic wave device 10a is not limited thereto, but may be replaced with various substrates generally used in the art.

As illustrated in FIG. 2, an acoustic wave generator 110 is provided on one surface of the substrate 100.

When the acoustic wave device 10a is provided as a bulk acoustic wave (BAW) filter, the acoustic wave generator 110 may be formed as a separate structure. For example, the acoustic wave generator 110 may include a piezoelectric thin film resonator converting electrical signals into mechanical signals or mechanical signals into electrical signals.

In this case, in the acoustic wave generator 110, a first electrode 116, a piezoelectric layer 114, and a second electrode 112 may be sequentially stacked from a lower portion thereof to form a resonance component, as illustrated in FIG. 2.

Figure 14:
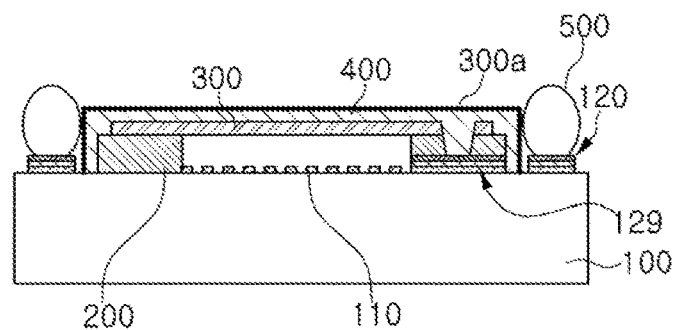
FIG. 14 is a schematic cross-sectional view illustrating an acoustic wave device according to another exemplary embodiment in the present disclosure.

Meanwhile, in an example in which the acoustic wave device 10a is used as the surface acoustic wave (SAW) filter, the acoustic wave generator 110 may be formed of a metal electrode, as illustrated in FIG. 14. The acoustic wave generator 110 may be formed of aluminum or copper, and include an interdigital transducer (IDT) electrode in which a plurality of electrodes alternately intersect each other in a comb pattern shape.

In this case, the acoustic wave generator 110 may be provided by forming a metal layer on the substrate 100 and processing the metal layer in a predetermined electrode form using a photolithography method.

The support component 200 may be disposed on one surface of the substrate 100. The support component 200 may be formed to cover an electrode 118 connected to the acoustic wave generator 110. However, the support component 200 is not limited thereto but may be disposed so that the electrode 118 is exposed.

The support component 200 may be continuously formed to enclose a circumference of the acoustic wave generator 110.

The support component 200 may be formed of an insulating material such as a resin or a polymer. However, a material of the support component 200 is not limited thereto, and in an example in which the support component 200 is sufficiently spaced apart from the acoustic wave generator 110 or the support component 200 and the acoustic wave generator 110 are insulated from each other, the support component 200 may be formed of a metal material.

Further, the support component 200 may protrude from one surface of the substrate 100 with a protrusion height. In this example, the protrusion height of the support component 200 may be greater than a thickness of the acoustic wave generator 110. Therefore, a gap may be formed between a protective member 300 seated on the support component 200 and the acoustic wave generator 110.

Meanwhile, a structure of the support component 200 according to the present exemplary embodiment is not limited to the above-mentioned structure, but may be variously changed provided that the gap may be formed between the protective member 300 and the acoustic wave generator 110.

The protective member 300 may be disposed on the support component 200. The acoustic wave generator 110 may deform while resonating. Thus, the support component 200 is configured to enable the acoustic wave generator 110 and the protective member 300 to be spaced apart from each other so that the acoustic wave generator 110 does not contact or is separated from the protective member 300 while resonating.

Therefore, in one example, a space portion d is formed between the acoustic wave generator 110, the support component 200, and the protective member 300. The space portion d is used as a deformation space of the acoustic wave generator 110 at the time of driving the acoustic wave device 10*a*.

The protective member 300 may entirely cover an upper portion of the acoustic wave generator 110.

The protective member 300 may be provided in order to suppress a sealing component 400, to be described below, from being deformed toward the space portion d by external force and contacting the acoustic wave generator 110. In accordance with an exemplary embodiment, the protective member 300 may have a flat plate shape, and be formed of a conductive metal plate (for example, a copper plate) in order to provide rigidity. However, a material of the protective member 300 is not limited thereto, but the protective member 300 may be formed of another material as long as it may provide the same rigidity as that of the metal as in an exemplary embodiment to be described below.

The protective member 300 may be seated on the support component 200, while entirely or partially contacting an upper surface of the support component 200. In an example in which the protective member 300 partially contacts the upper surface of the support component 200, a step portion may be formed at ends of the protective member 300 and between an exterior of the protective member 300 and the support component 200.

In an example in which the step portion is formed, a contact area of the support component 200 with a sealing component 400, to be described below, is increased. Therefore, the step portion may advantageously seal the space portion d from external air.

The sealing component 400 may seal exteriors of the protective member 300 and the support component 200.

The sealing component 400 may seal the exteriors of the protective member 300 and the support component 200 to, at least, prevent moisture and foreign objects from infiltrating into the space portion d between the protective member 300 and the support component 200.

The sealing component 400 may be disposed on external surfaces of the protective member 300, the support component 200, and the substrate 100. However, the sealing component 400 is not limited thereto. If necessary, the sealing component 400 may be partially formed. For example, the sealing component 400 may only be formed on the external surfaces of the protective member 300 and the support component 200.

The sealing component 400 may be formed of a thin film including at least one ingredient selected from the group consisting of silicon nitride ($Si_xN_y$), silicon dioxide ($SiO_2$), silicon oxy-nitride ($SiO_xN_y$), and silicon carbide (SiC).

However, a material of the sealing component 400 is not limited thereto. The sealing component 400 may also be formed of a metal material such as Au, Ni, Pt, Cu, Al, or the like.

The sealing component 400 may be formed through a vapor deposition method. For example, the sealing component 400 may be formed through a physical vapor deposition (PVD) method or a chemical vapor deposition (CVD) method.

In more detail, the sealing component 400 may be formed using any one method among a sputtering method, an E-beam evaporation method, a thermal evaporation method, a laser molecular beam epitaxy (L-MBE) method, a pulsed laser deposition (PLD) method, a metal-organic chemical vapor deposition (MOCVD) method, a hydride vapor phase epitaxy (HVPE) method, and a plasma enhanced chemical vapor deposition (PECVD) method. However, a method of forming the sealing component 400 is not limited thereto.

A connection terminal 500 may be disposed on the other surface of the substrate 100 and electrically connected to the acoustic wave generator 110 through a conductive via 600.

The connection terminal 500 may electrically and physically connect a main board (or a package board) on which the acoustic wave device 10*a* is mounted to the acoustic wave device 10*a*. The connection terminal 500 may be formed as a solder ball, a solder bump, or other shapes, but is not limited thereto.

The connection terminal 500 may be bonded to the substrate 100 via an electrode pad 120.

A plurality of electrode pads 120 may be disposed on one surface of the substrate 100 or the other surface thereof, and each of the electrode pads 120 may include at least one ground pad 120*a*.

The connection terminal 500 may be bonded to each of the electrode pads 120. In addition, a connection conductor 220, to be described below, may be connected to the ground pad 120*a* and electrically connected to a ground of the substrate 100. Further, among the connection terminals, the connection terminal 500 electrically connected to the ground pad 120*a* may serve as a ground terminal.

The electrode pad 120 may be electrically connected to the acoustic wave generator 110, through the conductive via 600 penetrating through the substrate 100.

The conductive via 600 may form an electrical connection between the connection terminal 500 and the acoustic wave generator 110 and penetrate through the substrate 100.

The conductive via 600 may be formed by filling a hole formed to penetrate through the substrate 100 with a conductive material or applying the conductive material on an inner surface of the hole. The conductive material forming the conductive via 600 may be Cu, Ag, Au, Ni, Pt, Pd, or an alloy thereof.

Further, the acoustic wave device 10*a* according to the present exemplary embodiment may include at least one connection conductor 220 formed in the support component 200.

The connection conductor 220 may have conductivity and may penetrate through the support component 200 to electrically connect the protective member 300 and the ground pad 120*a* of the substrate 100 to each other. Therefore, in the acoustic wave device 10*a* according to the present exemplary embodiment, the protective member 300 and the connection conductor 220 may serve as shielding members.

Meanwhile, the acoustic wave device according to the present disclosure is not limited to the exemplary embodiment described above but may be variously modified.

Figure 3:
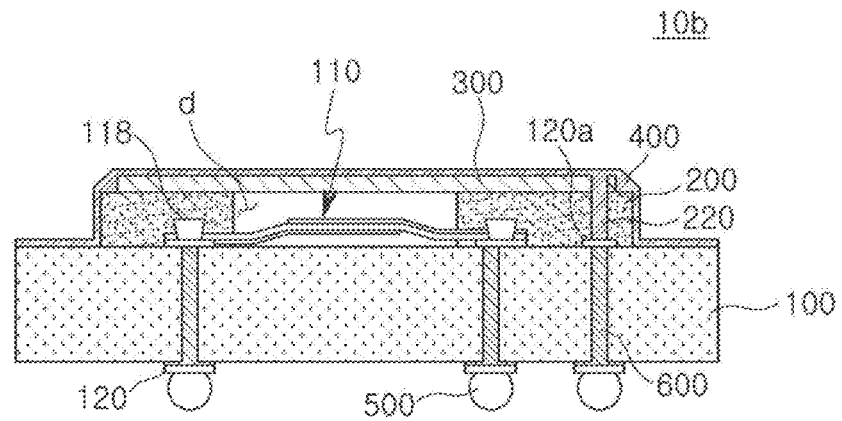
FIG. 3 is a cross-sectional view schematically illustrating an acoustic wave device according to another exemplary embodiment in the present disclosure.

FIG. 3 is a cross-sectional view schematically illustrating an acoustic wave device according to another exemplary embodiment in the present disclosure.

Referring to FIG. 3, in an acoustic wave device 10*b* according to the present exemplary embodiment, a sealing component 400 may be formed of a conductive material rather than an insulating material. Therefore, the sealing component 400 and a protective member 300 may serve as shielding members blocking electromagnetic waves.

Further, in the acoustic wave device 10*b* according to the present exemplary embodiment, a connection conductor 220 may penetrate through the protective member 300 and a support component 200 to be connected to the sealing component 400.

To this end, according to an exemplary embodiment, before the sealing component 400 is formed, a hole penetrating through the protective member 300 and the support component 200 may be formed. In addition, while the conductive material forming the sealing component 400 is applied onto a surface of the protective member 300, or the like, the conductive material may also be filled in the hole, to simultaneously form the sealing component 400 and the connection conductor 220.

In the acoustic wave device 10*b* according to the present exemplary embodiment as described above, because the entire sealing component 400 and the protective member 300 may serve as the shielding member, electromagnetic waves may be blocked across a wider area. Further, there is an advantage in that the acoustic wave device 10*b* may be easily manufactured.

Figure 4:
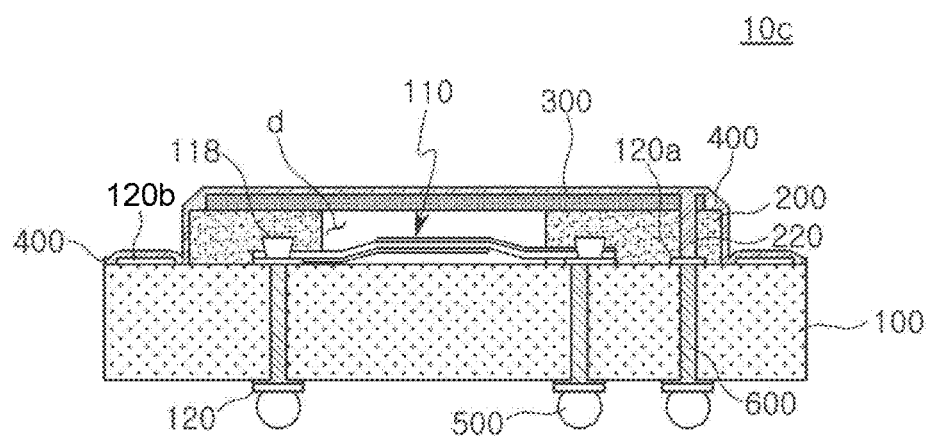
FIG. 4 is a cross-sectional view schematically illustrating an acoustic wave device according to another exemplary embodiment in the present disclosure.

FIG. 4 is a cross-sectional view schematically illustrating an acoustic wave device according to another exemplary embodiment in the present disclosure.

Referring to FIG. 4, in an acoustic wave device 10*c* according to the present exemplary embodiment, a protective member 300 may be formed of an insulating material rather than a metal material. For example, the protective member 300 may be formed of a wafer, a polymer, or a resin material.

In addition, the sealing component 400 may be formed of a conductive material, similarly to the exemplary embodiment described above.

According to the present exemplary embodiment, because the protective member 300 is formed of the insulating material, the protective member 300 does not block electromagnetic waves. However, the sealing component 400, which is conductive, may block electromagnetic waves. In other words, according to the present exemplary embodiment, the protective member 300 may serve only to reinforce rigidity, and only the sealing component 400 and a connection conductor 220 may serve as shielding members.

Further, in the acoustic wave device 10*c* according to the present exemplary embodiment, at least one ground pad 120*b* may be disposed outside a support component 200. In addition, the sealing component 400 may be directly connected to the ground pad 120*b*.

Direct connection between the sealing component 400 and the ground pad 120*b* may be implemented by exposing the ground pad 120*b* to the outside and forming the sealing component 400 on an outer surface of a substrate 100.

Therefore, even though a connection electrode 220 is omitted in the acoustic wave device 10*c* according to the present exemplary embodiment, the sealing component 400, the shielding member, may be directly connected to the ground pad 120*b* of the substrate 100.

Figure 5:
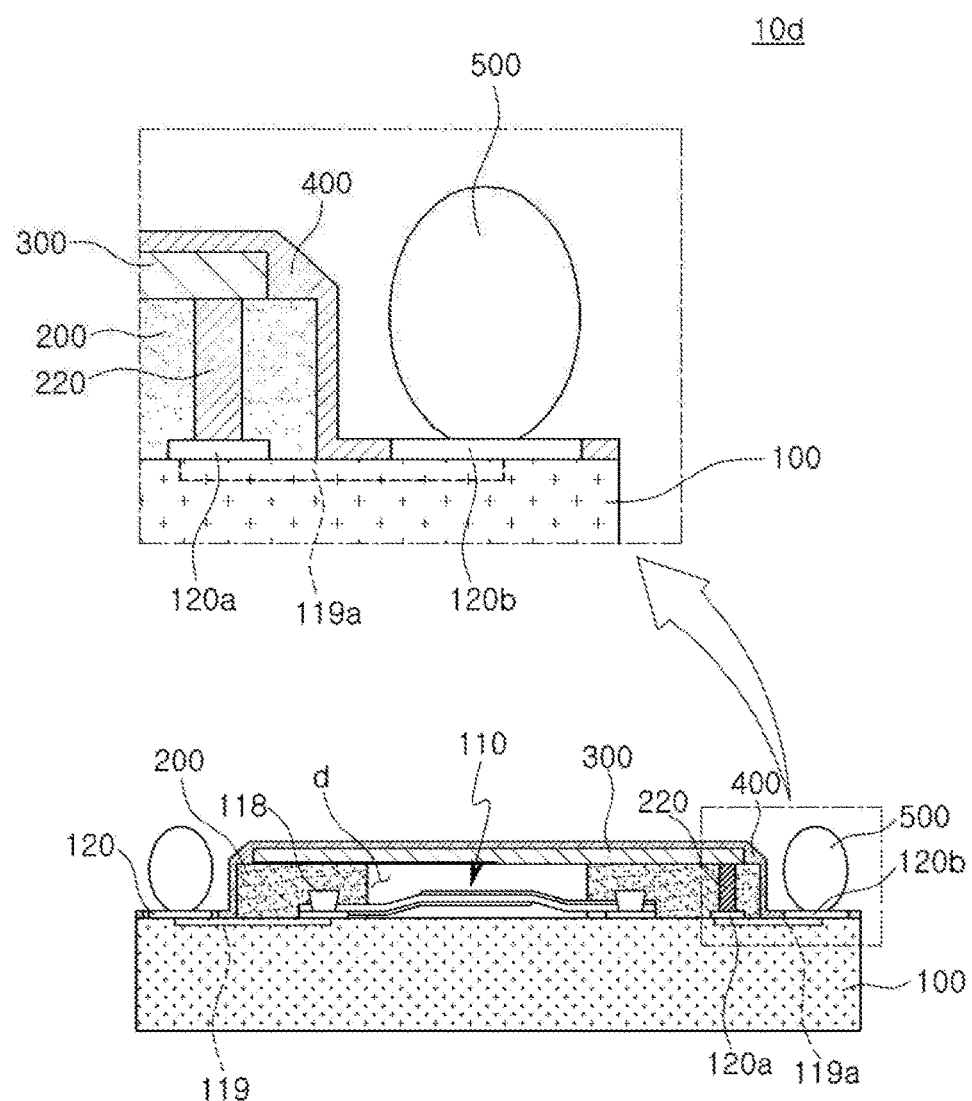
FIG. 5 is a cross-sectional view schematically illustrating an acoustic wave device according to another exemplary embodiment in the present disclosure.

FIG. 5 is a cross-sectional view schematically illustrating an acoustic wave device according to another exemplary embodiment in the present disclosure.

Referring to FIG. 5, in an acoustic wave device 10*d* according to the present exemplary embodiment, connection terminals 500 may be disposed on one surface of a substrate 100 on which an acoustic wave generator 110 is disposed.

The connection terminals 500 may be disposed outside a support component 200, and electrically connected to the acoustic wave generator 110 or a ground pad 120*a*, through a wiring pattern 119 or 119*a*, which is formed on a surface of the substrate 100 or in the substrate 100.

The connection terminals 500 may be bonded to the substrate 100 through electrode pads 120. The connection terminals 500 may be provided in order to electrically connect a package board 2 (in FIG. 10) and the acoustic wave device 10*d* to each other.

Further, if necessary, the ground pad 120*b* outside the support component 200 may be directly connected to a conductive sealing component 400 without the wiring pattern 119*a* or a connection conductor 220.

Figure 10:
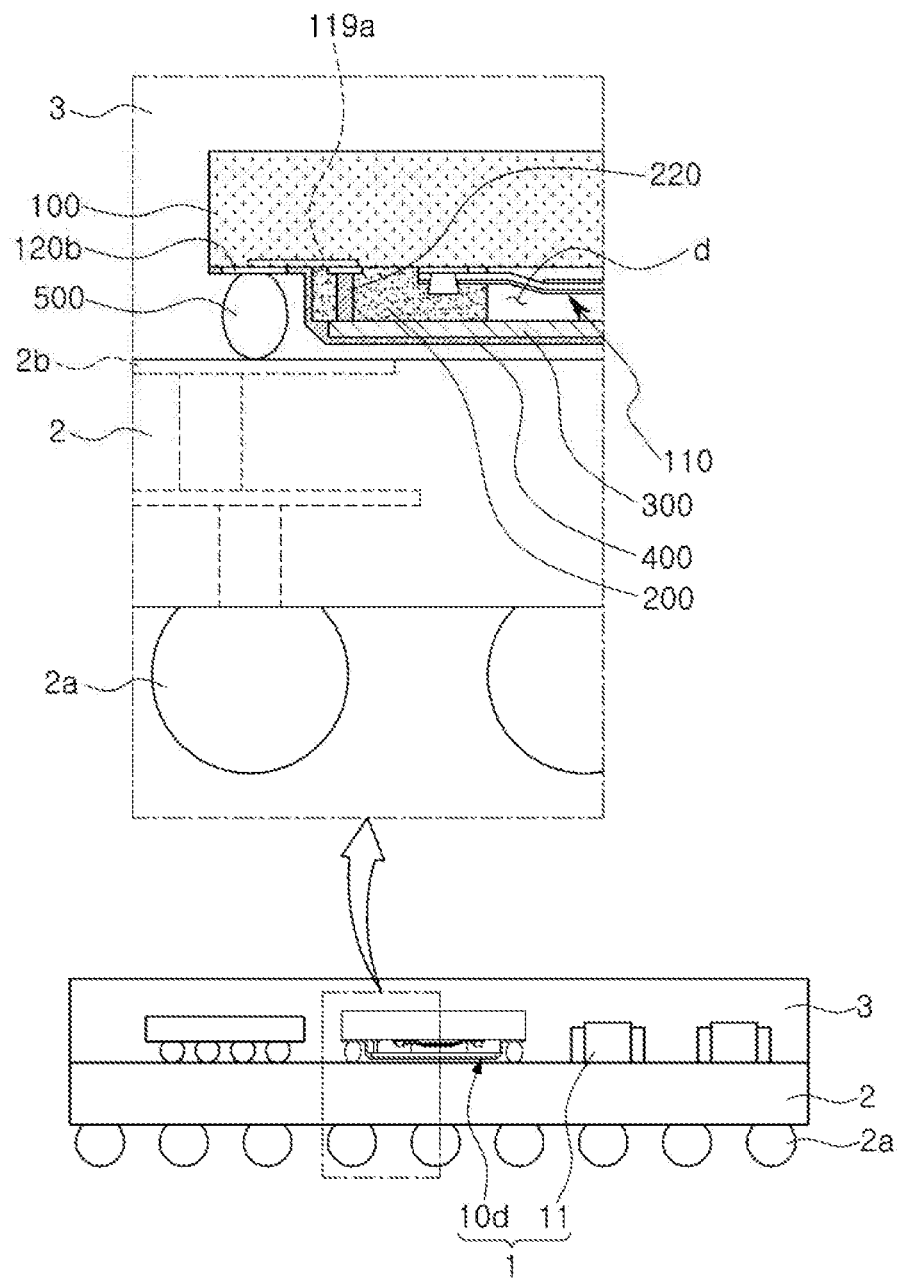

In addition, a vertical distance from one surface of the substrate 100 to a distal end of the connection terminal 500 may be longer than a vertical length from one surface of the substrate 100 to the sealing component 400 so that the sealing component 400 is spaced apart from the package board 2, when the acoustic wave device 10*d* is mounted on the package board 2 as illustrated in FIG. 10.

Figure 6:
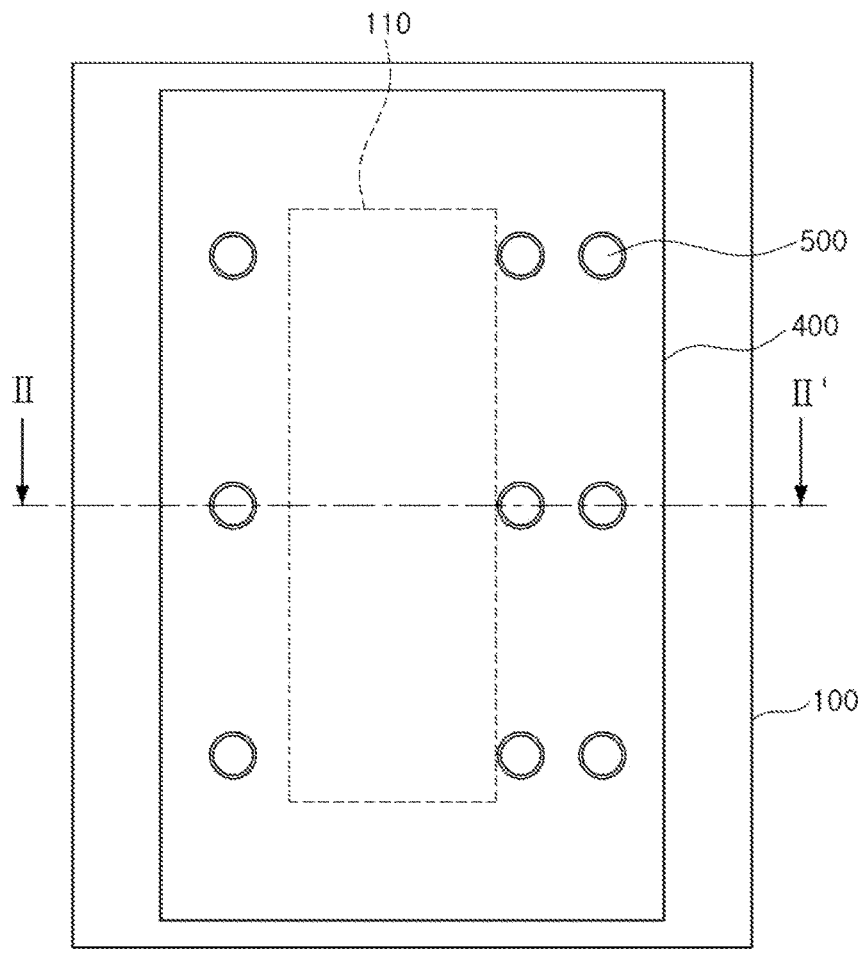
FIG. 6 is a plan view schematically illustrating an acoustic wave device according to another exemplary embodiment in the present disclosure.
Figure 7:
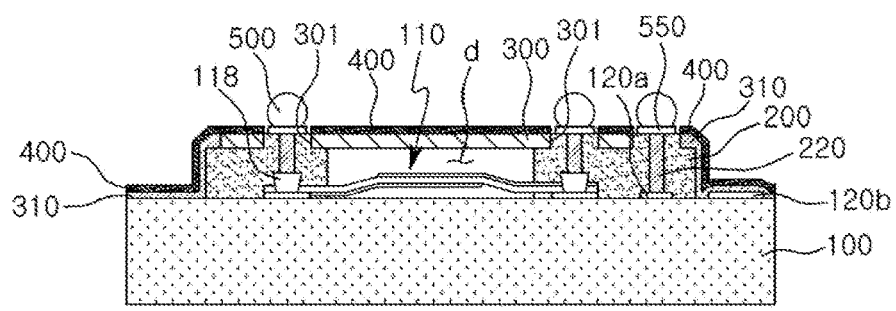
FIG. 7 is a cross-sectional view taken along line II-II' of FIG. 6.

FIG. 6 is a plan view schematically illustrating an acoustic wave device according to another exemplary embodiment in the present disclosure, and FIG. 7 is a cross-sectional view taken along line II-II' of FIG. 6.

Referring to FIGS. 6 and 7, in an acoustic wave device 10*e* according to the present exemplary embodiment, connection terminals 500 may be disposed on a support component 200, and a protective member 300 may be formed of a conductive material.

In an example in which the connection terminals 500 are directly formed on the protective member 300, which is conductive, a short circuit may occur between the protective member 300 and the connection terminals 500. Therefore, the protective member 300, according to the present exemplary embodiment, may include a plurality of penetration components 301 in positions corresponding to positions or locations of the connection terminals 500. A support component 200 formed of an insulating material may be disposed in the penetration components 301.

In addition, the connection terminals 500 may be disposed on a surface of the support component 200, which is formed of the insulating material, rather than the protective member 300, which is formed of the conductive material.

Further, connection conductors 220 may be disposed in the support component 200 disposed in the penetration components 301, respectively. The connection conductor 220 may electrically connect the connection terminal 500 and an acoustic wave generator 110 to each other, or electrically connect the connection terminal 500 and a ground pad 120*a* of a substrate 100 to each other. Therefore, at least one of the connection terminals 500 may be used as a ground terminal.

In addition, a conductive film. 310 may be formed around the protective member 300. Further, a sealing component 400 formed of an insulating material may be formed on surfaces of the conductive film 310, the protective member 300, and the substrate 100.

The conductive film 310 may contact a side surface or circumferential portion of the protective member 300, and be formed on the surfaces of the support component 200 and the substrate 100 to, thus, be connected to the ground pad 120a of the substrate 100.

Therefore, the protective member 300 may be electrically connected to the ground pad 120a through the conductive film 310. However, a configuration of the acoustic wave device 10e may be variously modified, as needed. For example, the conductive film 310 may be omitted, and the protective member 300 may be directly electrically connected to the ground terminal.

Meanwhile, a pad type bonding component 550 may be interposed between the support component 200 exposed through the penetration component 301 and the connection terminal 500 so that the connection terminal 500 may be firmly bonded on the support component 200.

Figure 8:
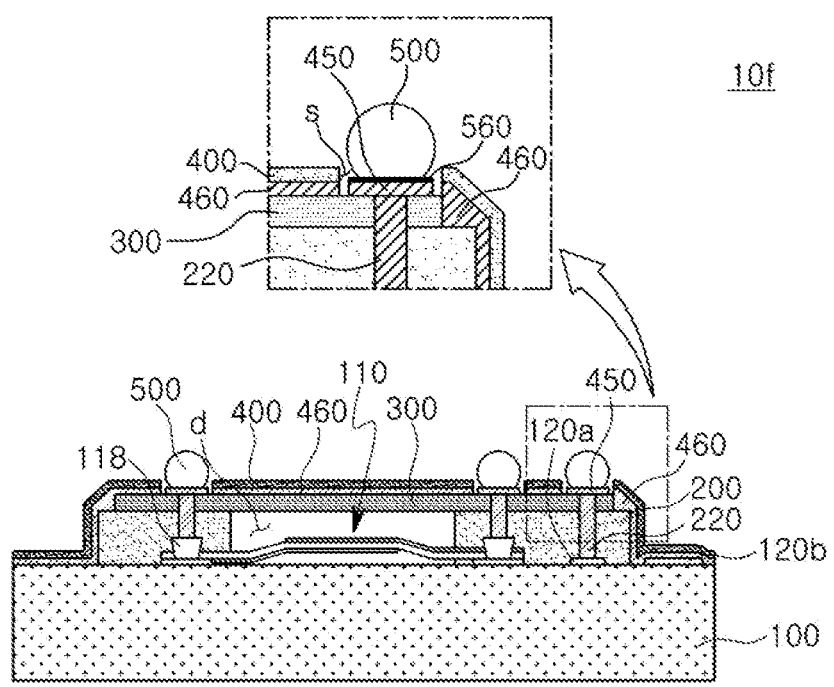
FIG. 8 is a cross-sectional view schematically illustrating an acoustic wave device according to another exemplary embodiment in the present disclosure.

FIG. 8 is a cross-sectional view schematically illustrating an acoustic wave device according to another exemplary embodiment in the present disclosure.

Referring to FIG. 8, in an acoustic wave device 10f according to the present exemplary embodiment, connection terminals 500 may be disposed on a support component 200, and a protective member 300 may be formed of an insulating material.

As the protective member 300 is formed of the insulating material, first sealing components 450 and 460 including an electrode pad type bonding component 450 and a shielding film 460 may be disposed on the protective member 300 of the acoustic wave device 10f according to the present exemplary embodiment.

The connection terminals 500 may be bonded to the bonding component 450. Therefore, the bonding component 450 may perform functions similar to those of the electrode pad described above, but the bonding component 450 may be disposed on the protective member 300 rather than on a substrate 100. In addition, an under barrier metal (UBM) layer 560 may be interposed between the bonding component 450 and the connection terminal 500 so that the connection terminal 500 is firmly bonded to the bonding component 450.

The shielding film 460 may be disposed on a portion of a surface of the protective member 300 on which the bonding component 450 is not formed. The shielding film 460 may also be disposed on a surface of the support component 200 or the substrate 100 to block electromagnetic waves. In addition, the shielding film 460 may be electrically connected to a ground pad 120b while covering the ground pad 120b of the substrate 100 formed on the surface of the substrate 100.

A separated space s may be formed between the bonding component 450 and the shielding film 460. The separated space s may prevent the bonding component 450 and the shielding film 460 from being electrically connected to each other, and be formed as a groove having a ring shape along a circumference of the bonding component 450.

The bonding component 450 and the shielding film 460 may be formed from one conductive film. For example, after forming the conductive film covering the overall surfaces of the protective member 300, the support component 200, and the substrate 100, the bonding component 450 and the shielding film 460 may be electrically separated from each other by partially removing the conductive film to form the separated space s.

Meanwhile, although the separated space s is formed as an empty space in the present exemplary embodiment, the separated space s may be variously modified. For example, a separate insulating member may be filled in the separated space s.

A plurality of connection conductors 220 may be disposed in the support component 200 and the protective member 300. The connection conductors 220 may be disposed to penetrate through the support component 200 and the protective member 300 to electrically connect the connection terminal and an acoustic wave generator 110 to each other or electrically connect the connection terminal 500 and the ground pad 120a to each other.

Further, a second sealing component 400 having insulation properties may be formed on surfaces of the first sealing components 450 and 460, which are conductive. The second sealing component 400 may insulate the first sealing components 450 and 460 from the outside while entirely covering the first sealing components 450 and 460.

Figure 9:
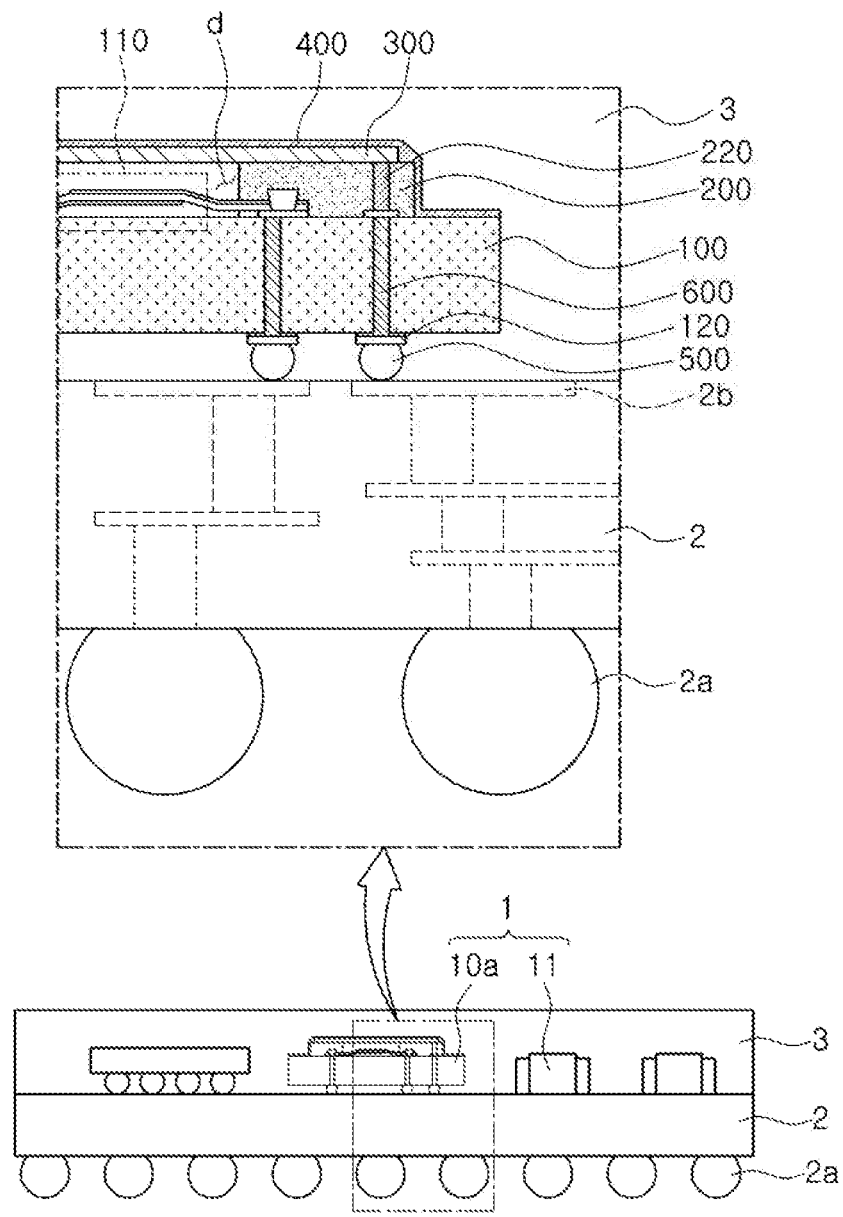
FIGS. 9 and 10 are schematic cross-sectional views illustrating acoustic wave device packages according to other exemplary embodiments in the present disclosure, respectively.

FIGS. 9 and 10 are schematic cross-sectional views illustrating acoustic wave device packages according to other exemplary embodiments in the present disclosure, respectively.

Referring to FIGS. 9 and 10, the acoustic wave device package may include a package board 2, a plurality of electronic elements 1 mounted on the package board 2, and an encapsulation component 3.

As the electronic element 1, any electronic component may be used as long as the electronic component may be mounted on the package board 2. For example, the electronic element 1 may be an active element, such as a battery, a generator, or an operational amplifier, or a passive element, such as a resistor, a capacitor, or an inductor.

Further, the electronic elements 1 according to the present exemplary embodiment may include at least one acoustic wave device. A case of using the acoustic wave device 10a illustrated in FIG. 2 is illustrated in FIG. 9, and a case of using the acoustic wave device 10d illustrated in FIG. 5 is illustrated in FIG. 10. However, the acoustic wave device package is not limited thereto.

As the package board 2, various types of boards (for example, a ceramic board, a printed circuit board, a glass board, a flexible board, or the like) may be used, and at least one electronic element 1 may be mounted on at least one surface of the package board 2. Further, a plurality of external connection terminals 2a may be disposed on the other surface of the package board 2.

The encapsulation component 3 may encapsulate the electronic elements 1 mounted on the package board 2. Further, the encapsulation component 3 may be filled between the electronic elements 1 mounted on the package board 2 to prevent an electric short-circuit from occurring between the electronic elements 1, and fix the electronic elements 1 onto the package board 2 while enclosing outer portions of the electronic elements 1. As a result, the electronic elements 1 may be safely protected from external impacts.

The encapsulation component 3 may be formed by an injection molding method or a molding method. For example, an epoxy mold compound (EMC) may be used as a material of the encapsulation component 3. However, a method of forming the encapsulation component 3 is not limited thereto. If it is necessary to form the encapsulation component 3, various methods, such as a method of compressing a semi-cured resin, or the like, may be used.

Referring to FIG. 9, the acoustic wave device package according to the present exemplary embodiment may include a metal plate 300 disposed to be in parallel with and be spaced apart from the package board 2, an acoustic wave generator 110 disposed between the metal plate 300 and the package board 2, and an acoustic wave device substrate 100. Here, the metal plate 300 may be a specific example of the protective member. Therefore, the metal plate 300 may be denoted by the same reference numeral as that of the protective member.

The metal plate 300 may be connected to a ground pad 2*b* of the package board 2 by a connection conductor 220 penetrating through a support component 200 and a conductive via 600 penetrating through the acoustic wave device substrate 100.

Further, the acoustic wave generator 110 may be disposed between the metal plate 300 and the acoustic wave device substrate 100.

Referring to FIG. 10, the acoustic wave device package according to the present exemplary embodiment may include an acoustic wave device substrate 100 and a package board 2 disposed to be parallel with each other, and a metal plate 300 disposed between the acoustic wave device substrate 100 and the package board 2 and connected to a ground pad 120*b* of the acoustic wave device substrate 100.

In this case, the metal plate 300 may be electrically connected to the ground pad 120*b* and a ground terminal 500 through a sealing component 400 or a connection conductor 220, which is conductive. In addition, the acoustic wave device 10*d* may be electrically connected to a ground pad 2*b* of the package board 2 through the ground terminal 500 bonded to the ground pad 120*b*.

Further, an acoustic wave generator 110 may be disposed between the metal plate 300 and the acoustic wave device substrate 100. In addition, although not illustrated, an insulating film (not illustrated) may be formed on one surface of the metal plate 300 facing the acoustic wave generator 110.

Here, the insulating film may be formed of an oxide film. However, if necessary, the insulating film may be formed of a thin film including at least one ingredient selected from the group consisting of silicon nitride ($Si_xN_y$), silicon dioxide ($SiO_2$), silicon oxy-nitride ($SiO_xN_y$), and silicon carbide (SiC).

In the acoustic wave device package according to the present exemplary embodiment as described above, the acoustic wave device itself may include a shielding member. Therefore, because there is no need to entirely form a shielding layer on an outer surface of the encapsulation component 3, the package may be easily manufactured. Further, because the shielding layer may be omitted, an entire volume of the package may be decreased.

Figure 11:
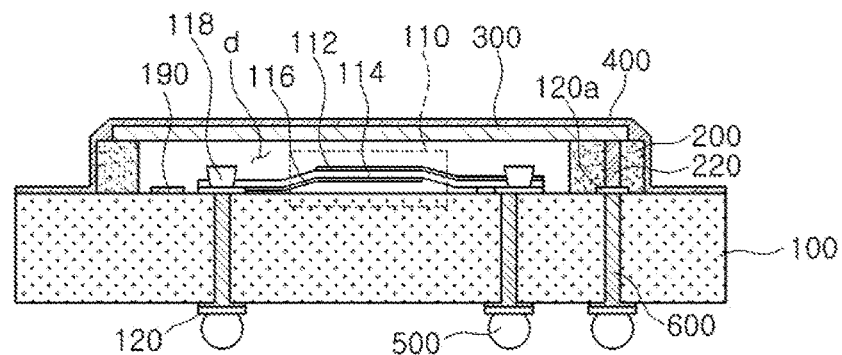
FIGS. 11 through 13 are schematic cross-sectional views illustrating acoustic wave devices according to other exemplary embodiments in the present disclosure, respectively.
Figure 12:
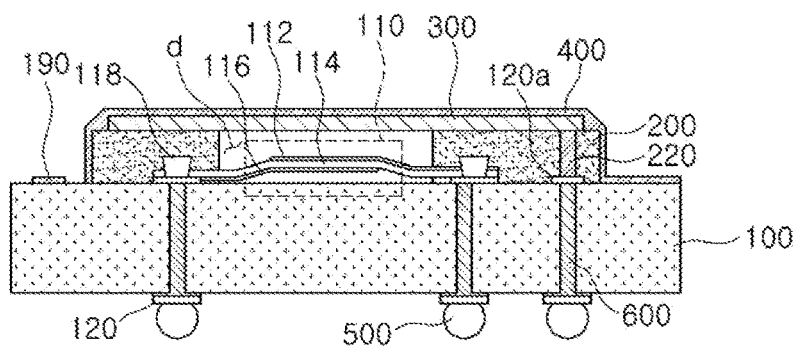
Figure 13:
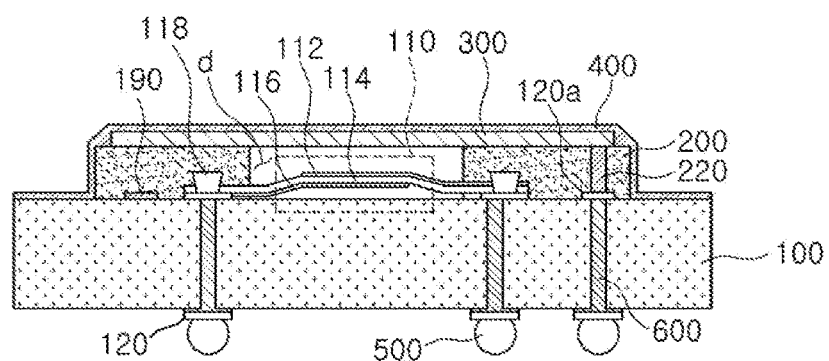

FIGS. 11 through 13 are schematic cross-sectional views illustrating acoustic wave devices according to other exemplary embodiments in the present disclosure, respectively.

First, referring to FIG. 11, the acoustic wave device according to the present exemplary embodiment may be configured similarly to the acoustic wave device illustrated in FIG. 2, and used as a duplexer.

To this end, the acoustic wave device according to the present exemplary embodiment may further include at least one antenna 190.

The antenna 190 may be disposed on a substrate 100 in a wiring pattern form, and electrically connected to an acoustic wave generator 110.

The antenna 190 according to the present exemplary embodiment may be disposed to be spaced apart from the acoustic wave generator 110 by a predetermined distance, and disposed in a space portion d together with the acoustic wave generator 110.

However, the antenna 190 is not limited thereto, but may be disposed outside a sealing component 400 as illustrated in FIG. 12, rather than inside the sealing component 400 used as a shielding member.

Further, as illustrated in FIG. 13, the antenna 190 may also be interposed between a substrate 100 and a support component 200. In this example, the acoustic wave device may be manufactured by forming the antenna 190 on the substrate 100 and then forming the support component 200 thereon.

Meanwhile, although a case in which the acoustic wave device illustrated in FIG. 2 is used as the duplexer is described by way of example in the present exemplary embodiment, the acoustic wave device is not limited thereto. That is, the acoustic wave devices according to the exemplary embodiments described above may also be used as duplexers by adding an antenna thereto.

FIG. 14 is a schematic cross-sectional view illustrating an acoustic wave device according to another exemplary embodiment in the present disclosure.

Referring to FIG. 14, the acoustic wave device according to the present exemplary embodiment may be used as a surface acoustic wave (SAW) filter. Therefore, an acoustic wave generator 110 may be formed of a metal electrode.

In a case in which the acoustic wave generator 110 is formed of an interdigital electrode, the electrode may be formed of aluminum or copper material and have a structure in which a plurality of electrodes alternately intersect each other in a comb pattern shape.

In this case, the acoustic wave generator 110 may be formed by forming a metal layer on a substrate 100 and processing the metal layer in a predetermined electrode form using a photolithography method.

According to the present exemplary embodiment, both a protective member 300 and a sealing component 400 may be formed of metal materials. However, the materials of the protective member 300 and the sealing component 400 are not limited thereto. However, the protective member 300 may be formed of an insulating material as in the exemplary embodiment illustrated in FIG. 8, or the sealing component 400 may be formed of an insulating material as in the exemplary embodiment illustrated in FIG. 7.

The sealing component 400 may be electrically connected to a ground pad 129 formed on the substrate 100 through a through hole formed in a support component 200.

Therefore, electromagnetic waves received at the acoustic wave generator 110 or emitted from the acoustic wave generator 110 may be easily blocked.

An insulating film 300*a* may be formed on a surface of the sealing component 400. The insulating film 300*a* may be formed of an oxide film. However, if necessary, the insulating film 300*a* may be formed of a thin film including at least one ingredient selected from the group consisting of silicon nitride ($Si_xN_y$), silicon dioxide ($SiO_2$), silicon oxy-nitride ($SiO_xN_y$), and silicon carbide (SiC).

The insulating film 300*a* may prevent a short circuit from occurring due to a contact between the sealing component 400 formed of a conductive material and a connection terminal 500. Therefore, in an example in which the sealing component 400 is formed of an insulating material, the insulating film 300*a* may be omitted.

Next, a method of manufacturing an acoustic wave device according to the present exemplary embodiment will be described.

Figure 15:
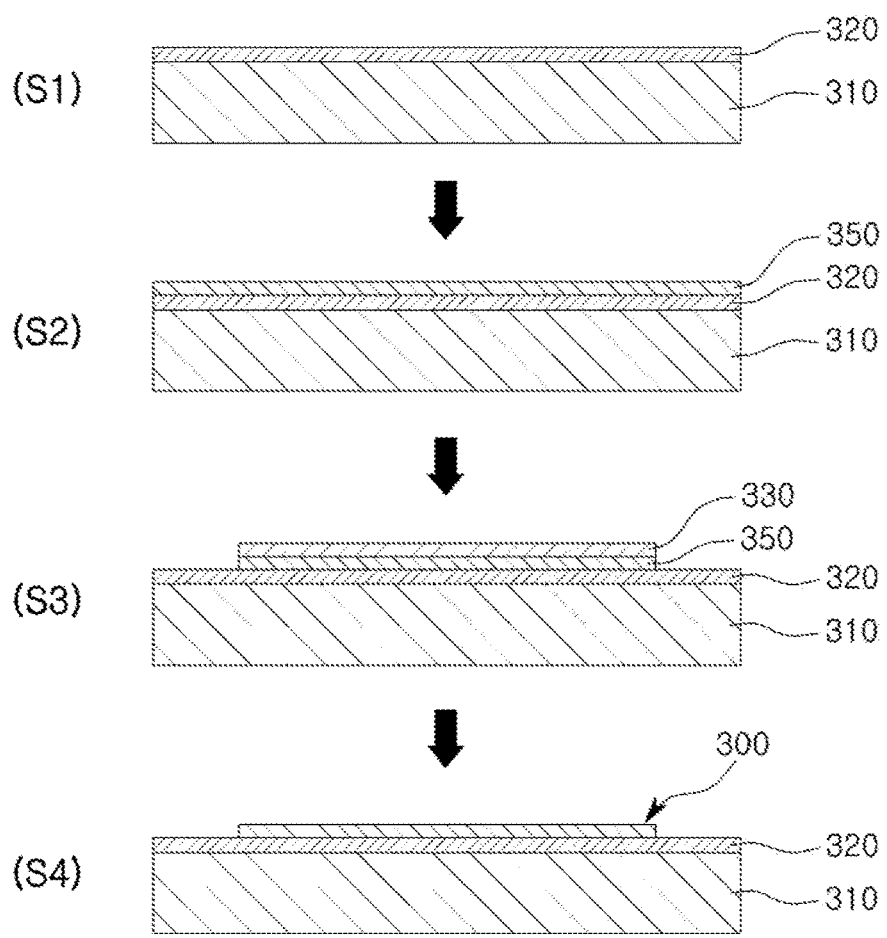
FIGS. 15 through 17 are views illustrating a method of manufacturing the acoustic wave device illustrated in FIG. 2.
Figure 16:
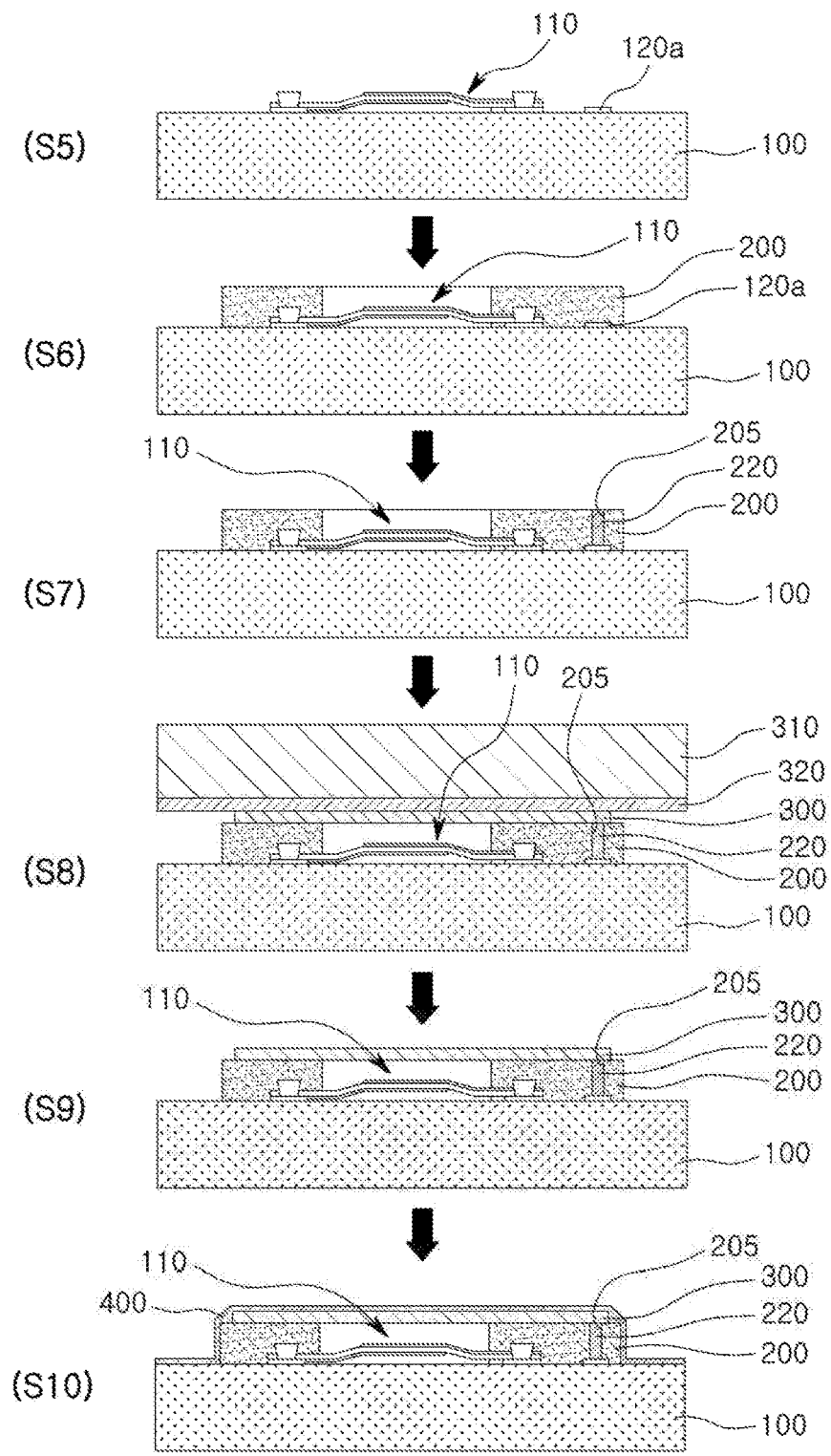
Figure 17:
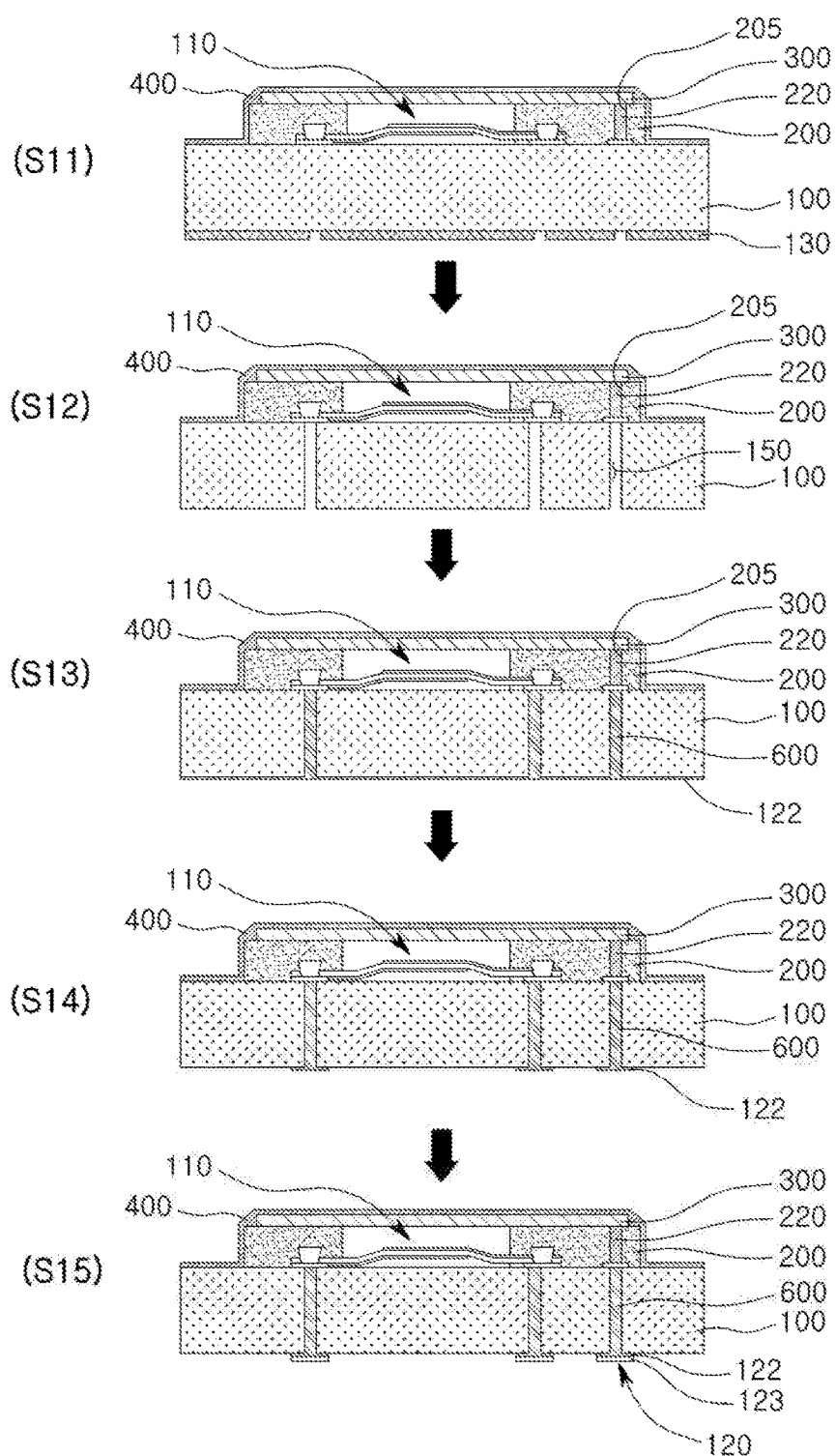

FIGS. 15 through 17 are views describing a method of manufacturing the acoustic wave device illustrated in FIG. 2.

Referring to FIGS. 15 and 17, in the method of manufacturing the acoustic wave device according to the present exemplary embodiment, the protective member 300 and the acoustic wave generator 110 may be separately manufactured and then coupled to each other.

First, a method of manufacturing the protective member 300 will be described.

An adhesive layer 320 may be formed on one surface of a base substrate 310 (S1).

As the base substrate 310, a wafer may be used. In addition, the adhesive layer 320 may be formed of an adhesive tape. For example, as the adhesive layer 320 according to the present exemplary embodiment, a thermally releasable double-sided adhesive tape may be used.

Next, a metal layer 350 may be formed on the adhesive layer 320 (S2).

The metal layer 350 may be formed of a copper (Cu) material on an entire upper surface of the adhesive layer 320.

Then, a mask layer 330 may be formed on the metal layer 350, and the metal layer 350 may be patterned using the mask layer 330 (S3).

Here, the mask layer 330 may be formed using a dry film photoresist (DFR), but is not limited thereto.

When the patterning of the metal layer 350 is completed, the mask layer 330 may be removed (S5). Therefore, the remaining metal layer 350 may serve as the protective member 300.

Next, an acoustic wave generator 110 may be formed on a substrate 100 used in the acoustic wave device (S5).

As the substrate 100, a Si substrate or a piezoelectric substrate may be used. In an example in which a SAW filter is used to implement the acoustic wave device, the piezoelectric substrate may be used as the substrate 100, and in an example in which a BAW filter is used to implement the acoustic wave device, the Si substrate may be used as the substrate 100.

However, the substrate 100 used in the acoustic wave device is not limited thereto, and may be replaced with various substrates generally used in the art.

In the present exemplary embodiment, the acoustic wave device used as the BAW filter will be described. Therefore, the acoustic wave generator 110 may include a piezoelectric thin film resonator and be provided on one surface of the substrate 100 as a separate structure in which a first electrode, a piezoelectric layer, and a second electrode are sequentially stacked.

However, the acoustic wave generator 110 is not limited thereto. That is, the acoustic wave device may be used as the SAW filter, the acoustic wave generator 110 may be formed of aluminum or copper, and may have an interdigital transducer (IDT) electrode structure in which a plurality of electrodes alternately intersect each other in a comb pattern shape.

In this case, the acoustic wave generator 110 may be provided by forming a conductor layer on the substrate 100 and processing the conductor layer in a predetermined electrode form using a photolithography method.

As described above, a structure and a method of manufacturing the acoustic wave generator 110 may be changed depending on the kind of acoustic wave device.

After the acoustic wave generator 110 is formed, a wiring pattern (not illustrated) electrically connected to the acoustic wave generator 110 and a ground pad 120a may be formed on one surface of the substrate 100.

Next, a support component 200 may be formed along a circumference of the acoustic wave generator 110 (S6).

The support component 200 may be formed of an insulating material such as a resin or a polymer. However, if necessary, the support component 200 may be formed of a metal material. The support component 200 may be formed using a photolithography method. However, a method of forming the support component 200 is not limited thereto.

Then, a connection conductor 220 may be formed in the support component 200 (S8). Here, the connection conductor 220 may be disposed to be electrically connected to the ground pad 120a of the substrate 100.

In S8, a through hole 205 may be formed in the support component 200 so that the ground pad 120a is exposed, and a conductive material may be provided in the through hole 205. Here, the conductive material may be provided in the through hole 205 by a plating method or a screen printing method.

Meanwhile, although a method of forming the support component 200 on the substrate 100 is described by way of example in the present exemplary embodiment, a manufacturing method according to the present disclosure is not limited thereto. For example, after the support component 200 is formed on the protective member 300 manufactured in S4 and the connection conductor 220 is formed in the support component 200, the support component 200 may be inversely bonded on the substrate 100.

Then, the protective member 300 may be transferred to the support component 200 (S8). At this time, the protective member 300 may be seated on the support component 200 while being spaced apart from the acoustic wave generator 110 by a predetermined distance.

The protective member 300 may be disposed to entirely cover an upper portion of the acoustic wave generator 110.

Here, the protective member 300 may partially contact an upper surface of the support component 200, and a step portion may be formed at ends of the protective member 300 and between an exterior of the protective member 300 and the support component 200.

In addition, the protection member 300 may be electrically connected to the connection conductor 220. Therefore, the protective member 300 may be electrically connected to the ground pad 120a through the connection conductor 220.

When the protective member 300 is transferred to the support component 200, the base substrate 310 attached to the protective member 300 via the adhesive layer 320 may be removed (S9). As described above, as the adhesive layer 320, a thermally releasable adhesive tape may be used. Therefore, the base substrate 310 may be separated from the protective member by applying heat to the adhesive layer 320. Meanwhile, in a case in which the adhesive layer 320 is formed of a UV tape, the base substrate 310 may be separated from the protective member 300 by irradiating UV lights to the adhesive layer 320.

Next, a sealing component 400 sealing the protective member 300 and the support component 200 may be formed (S10).

The sealing component 400 may be formed of a conductive material or an insulating material. The sealing component 400 may be formed by a physical vapor deposition (PVD) method, a chemical vapor deposition (CVD) method, or a plating method.

In more detail, the sealing component 400 may be formed using any one method among a sputtering method, an E-beam evaporation method, a thermal evaporation method, a laser molecular beam epitaxy (L-MBE) method, a pulsed laser deposition (PLD) method, a metal-organic chemical vapor deposition (MOCVD) method, a hydride vapor phase epitaxy (HVPE) method, and a plasma enhanced chemical vapor deposition (PECVD) method.

Then, sequentially, a mask layer 130 may be formed on a lower surface of the substrate 100 (S11), a via hole 150 may be formed in the substrate 100 using the mask layer 130 (S12), and then, a conductive via 600 may be formed by applying or providing a conductive material in the via hole 150 (S13).

The conductive via 600 may be formed in the via hole 150 by a plating method. Further, a plating layer 122 may also be formed on the lower surface of the substrate 100 while the conductive via 600 is formed.

The conductive via 600 and the plating layer 122 may be formed of a copper (Cu) material, but a material of the conductive via 600 and the plating layer 122 is not limited thereto.

At least one conductive via 600 may be electrically connected to the protective member 300 through the ground pad 120a.

Thereafter, an electrode pad 120 may be formed on the lower surface of the substrate 100.

In order to form the electrode pad 120, first, the plating layer 122 may be patterned in a form of the electrode pad 120 (S14).

In S14, after a mask (not illustrated) is formed on the plating layer 122, unnecessary regions except for a region on which the electrode pad 120 will be formed may be removed by a photolithography method. The mask may be formed using a photosensitive film.

Thereafter, after removing the mask, a conductive electrode layer 123 may be formed on the remaining plating layer 122 to complete the electrode pad 120 (S15).

The electrode layer 123 may be formed by a plating method. In addition, a plurality of metal layers may be formed. For example, the electrode layer 123 may be formed by sequentially stacking a nickel (Ni) layer and a gold (Au) layer using an electroplating method or an electroless plating method.

Thereafter, the acoustic wave device 10 illustrated in FIG. 2 may be completed by forming a connection terminal 500 on the electrode pad 120.

However, a position of the connection terminal 500 is not limited to the lower surface of the substrate 100, and may be variously changed as in the exemplary embodiments described above.

Meanwhile, in the manufacturing method according to the present exemplary embodiment, after the connection conductor 220 is formed in the support component 200, the protective member 300 may be disposed on the support component 200. However, a process sequence is not limited thereto.

For example, after the protective member 300 is disposed on a support component 200 to be described below, while the sealing component 400 is formed using a conductive material, the connection conductor 220 may also be formed by providing the conductive material in the protective member 300 and the support component 200. In this case, the acoustic wave device illustrated in FIG. 3 or 4 may be manufactured.

Meanwhile, the method of manufacturing an acoustic wave device according to the present exemplary embodiment is not limited thereto, and may be variously modified.

Figure 18A:
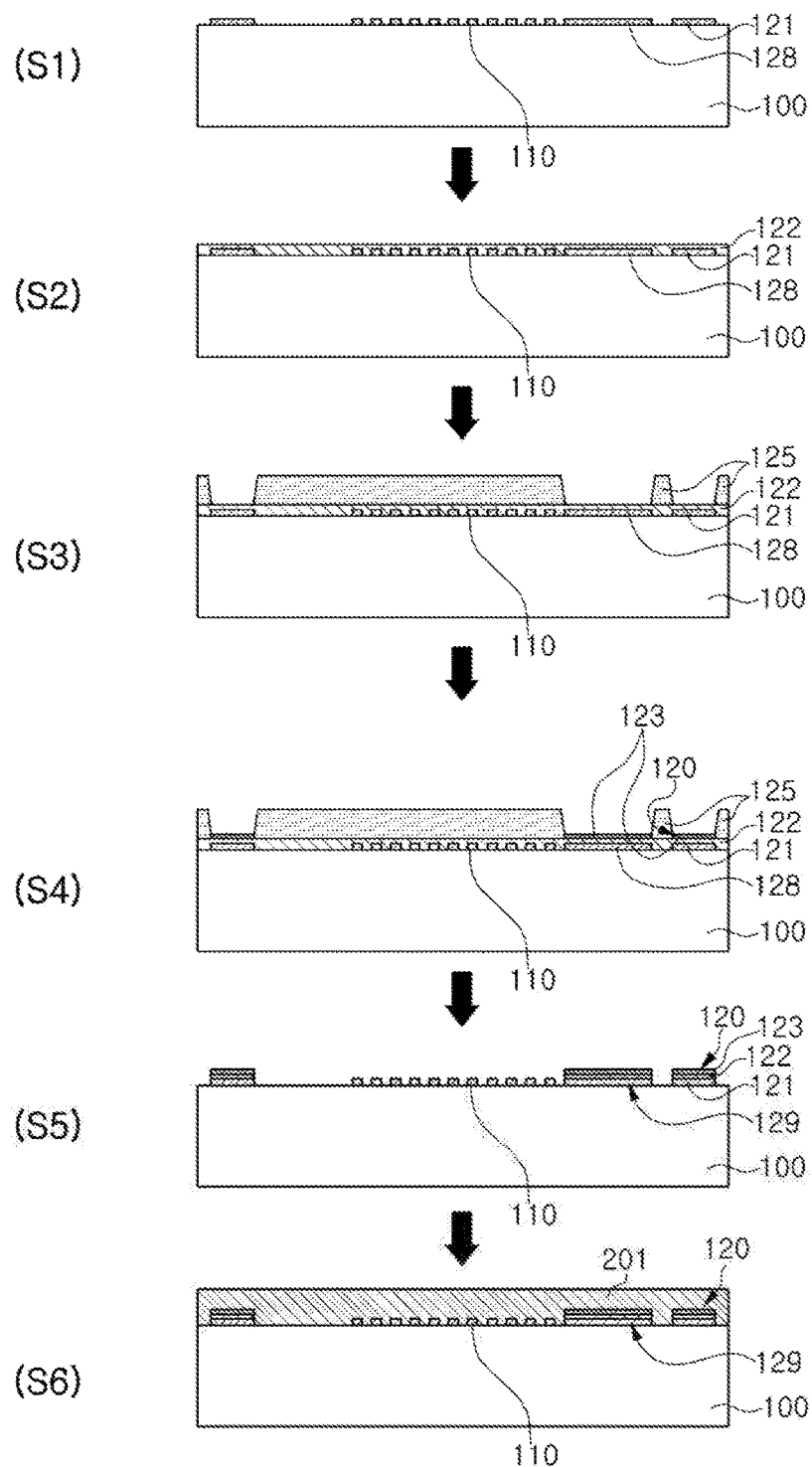
FIGS. 18A and 18B are views illustrating a method of manufacturing the acoustic wave device illustrated in FIG. 14.
Figure 18B:
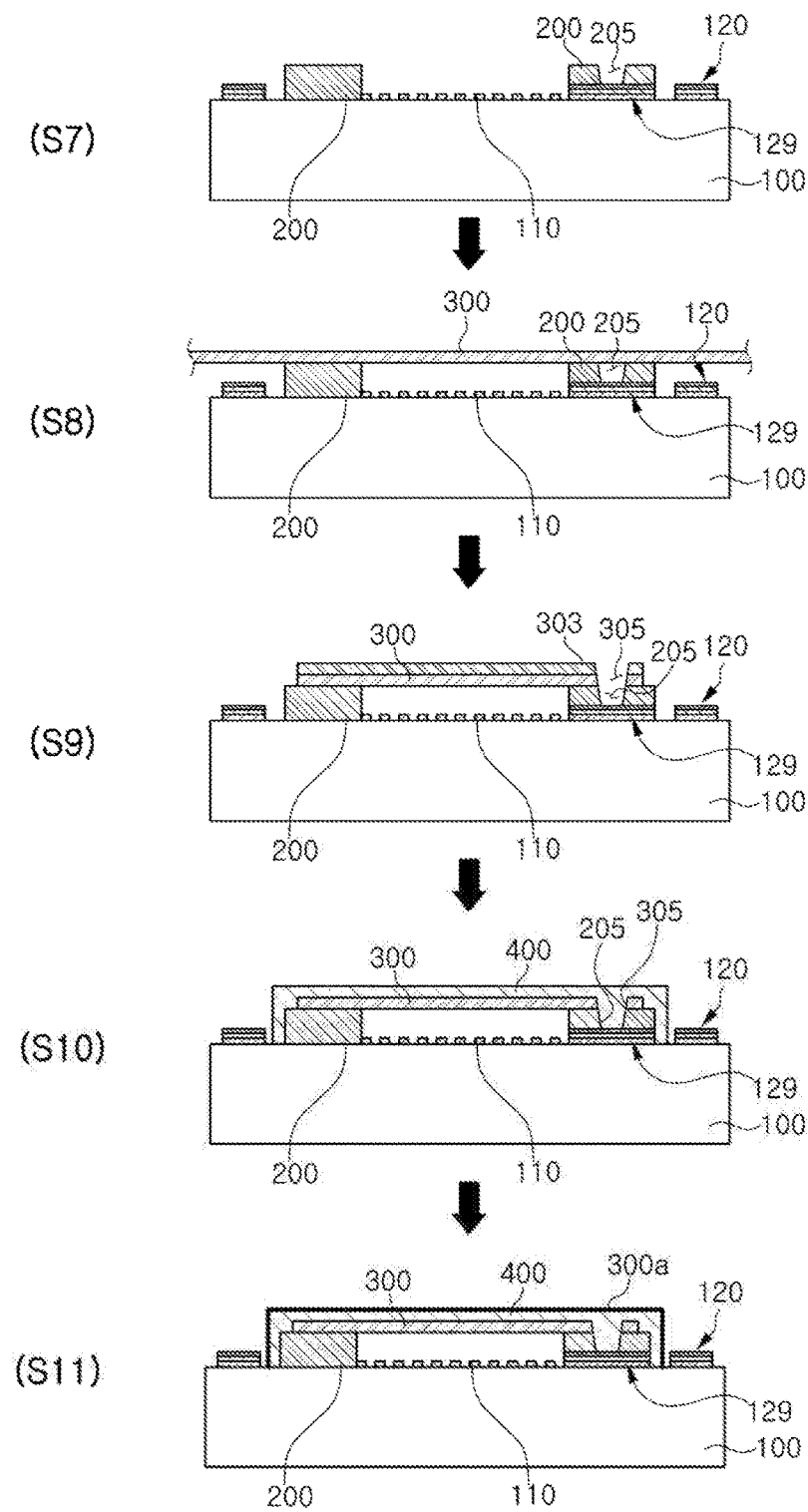

FIGS. 18A and 18B are views describing a method of manufacturing the acoustic wave device illustrated in FIG. 14.

Referring to FIGS. 18A and 18B, in the method of manufacturing the acoustic wave device according to the present exemplary embodiment, first, an acoustic wave generator 110 may be formed on a substrate 100 (S1).

The acoustic wave generator 110 as described above may be provided by forming a conductor layer on the substrate 100 and processing the conductor layer in a predetermined electrode form using a photolithography method.

Further, a wiring pattern (not illustrated) electrically connected to the acoustic wave generator 110 may be formed together with the acoustic wave generator 110 around the acoustic wave generator 110.

An insulating protective film (not illustrated) such as a $SiO_2$ film may be formed on surfaces of the acoustic wave generator 110 and the wiring pattern. A wiring layer 121, which is a portion of the wiring pattern, may be exposed to the outside of the insulating protective film. Exposed wiring layers 121 and 128 will later be formed as a ground pad 129 and an electrode pad 120.

Meanwhile, although a case of manufacturing a SAW filter in which the acoustic wave generator 110 is formed in a metal electrode form is described by way of example in the present exemplary embodiment, the acoustic wave generator 110 is not limited thereto. For example, the acoustic wave generator 110 may be formed in a piezoelectric thin film resonator form, and thus the acoustic wave device may be manufactured as a BAW filter.

Then, a seed layer 122 may be formed on the acoustic wave generator 110 and the wiring layers 121 and 128 (S2). The seed layer 122 may be provided in order to perform electroplating, and may be formed of a copper (Cu) material by a sputtering method. However, a method of forming the seed layer 122 is not limited thereto.

An insulating film may be formed on the acoustic wave generator 110. Therefore, the seed layer 122 may be directly bonded only to the wiring layers 121 and 128 exposed to the outside of the insulating film.

Next, after a mask layer 125 is formed on the seed layer 122, the mask layer 125 may be removed so that a portion of the seed layer 122 is exposed (S3). Here, regions of the seed layer 122 corresponding to the wiring layers 121 and 128 may be exposed.

Then, a shape of the electrode pad 120 may be formed by forming a plating layer 123 on the exposed seed layer 122 (S4). The plating layer 123 may be formed using the seed layer 122 by an electroplating method. However, the plating method is not limited thereto, and if necessary, an electroless plating method may also be used.

The plating layer 123 according to the present exemplary embodiment may be formed by sequentially stacking a nickel (Ni) layer and a gold (Au) layer on the seed layer 122. However, the plating layer 123 is not limited thereto.

Next, the mask layer 125 and the seed layer 122 may be removed (S5). Regions of the seed layer 122 except for regions thereof corresponding to the electrode pad 120 and the ground pad 129 may be removed. Therefore, the electrode pad 120, the ground pad 129, and the acoustic wave generator 110 may be formed on the substrate 100.

Here, in an example in which the acoustic wave device according to the present exemplary embodiment is manufactured in a SAW filter structure, the wiring layer 121 may be formed of an aluminum (Al) material. In this example, the wiring layer 121 exposed to the outside may be removed together during the etching to be performed later. Therefore, in order to prevent the exposed wiring layer 121 from being removed, in the acoustic wave device according to the present exemplary embodiment, the plating layer 123 may be formed on the exposed wiring layer 121 as a barrier layer.

However, in an example in which the acoustic wave device according to the present exemplary embodiment is manufactured in a BAW filter structure, since the wiring layer 121 is formed of a molybdenum (Mo) material or a gold (Au) material, which is not easily removed during the etching, the plating layer 123 or the seed layer 122, and the forming of the plating layer 123 and the seed layer 122, may be omitted.

Then, sequentially, a support layer 201 may be formed on one surface of the substrate 100 (S6), and then, a support component 200 may be formed along a circumference of the acoustic wave generator 110 by partially removing the support layer 201 (S7).

The support component 200 may be formed of an insulating material such as a resin or a polymer. However, if necessary, the support component 200 may be formed of a metal material. Further, the support component 200 may be formed using a photolithography method. However, the support component 200 is not limited thereto.

A portion of the support component 200 may be formed on the ground pad 129. Therefore, the ground pad 129 may be disposed between the support component 200 and the substrate 100.

While the support component 200 is formed, at least one through hole 205 may be formed in the support component 200. The through hole 205 may be formed on the ground pad 129, and thus the ground pad 129 may be partially exposed to the outside through the through hole 205.

Then, a protective member 300 may be stacked on the support component 200 (S8). At this time, the protective member 300 may be seated on the support component 200 while being spaced apart from the acoustic wave generator 110 by a predetermined distance.

The protective member 300 may be formed of a single metal sheet. For example, as the protective member, a copper (Cu) sheet may be used.

Figure 20:
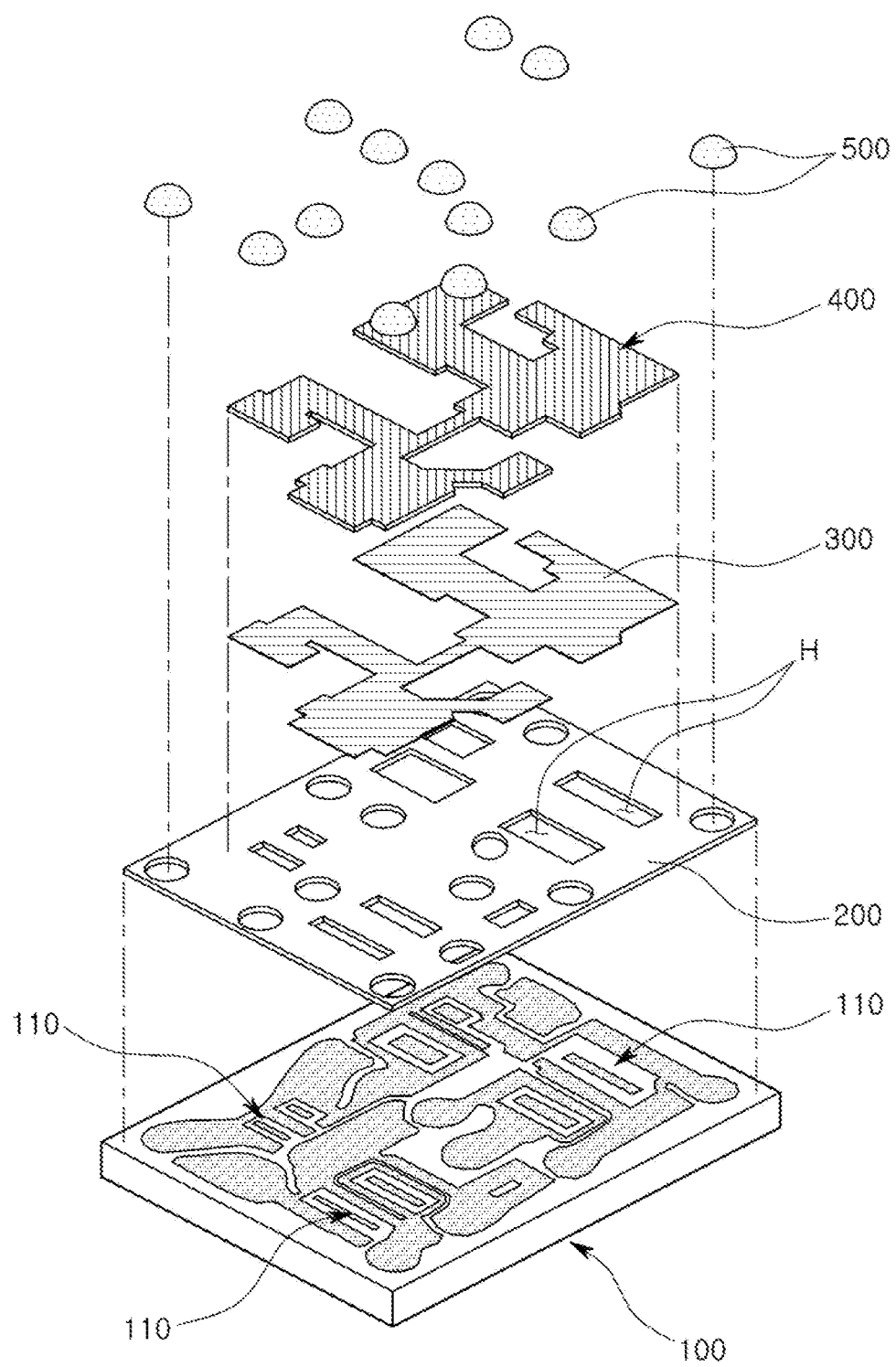
FIG. 20 is an exploded perspective view of the acoustic wave device illustrated in FIG. 19.

In addition, as illustrated in FIG. 20, the protective member 300 according to the present exemplary embodiment may be formed of a metal sheet having a wide area to cover a plurality of acoustic wave generators 110. Therefore, since an area of the protective member 300 supported by the support component 200 while contacting the support component 200 is similar to or larger than an area of the space portion d (in FIG. 2), a flat sheet shape may be maintained.

Then, a mask layer 303 may be formed on the protective member 300, and the protective member 300 may be patterned (S9). This operation (S9) may also be performed through a photolithography method.

Further, in S9, at least one through hole 305 may be formed in the protective member 300, and the through hole 305 of the protective member 300 may be formed to be extended from the through hole 205 of the support component 200. Therefore, the ground pad 129 formed on the substrate 100 may be exposed to the outside through the through holes 205 and 305.

Next, a sealing component 400 sealing the protective member 300 and the support component 200 may be formed (S10).

Here, the sealing component 400 may be formed of a metal material such as Au, Ni, Pt, Cu, Al, or the like.

In addition, the sealing component 400 may be provided in the through holes 205 and 305 to be electrically connected to the ground pad 129.

The sealing component 400 may be formed through a vapor deposition method as described above. However, a method of forming the sealing component 400 is not limited thereto, and may be variously changed. For example, the sealing component 400 may be formed using a plating method.

Thereafter, the acoustic wave device illustrated in FIG. 14 may be completed by forming a connection terminal 500 on the electrode pad 120.

Figure 19:
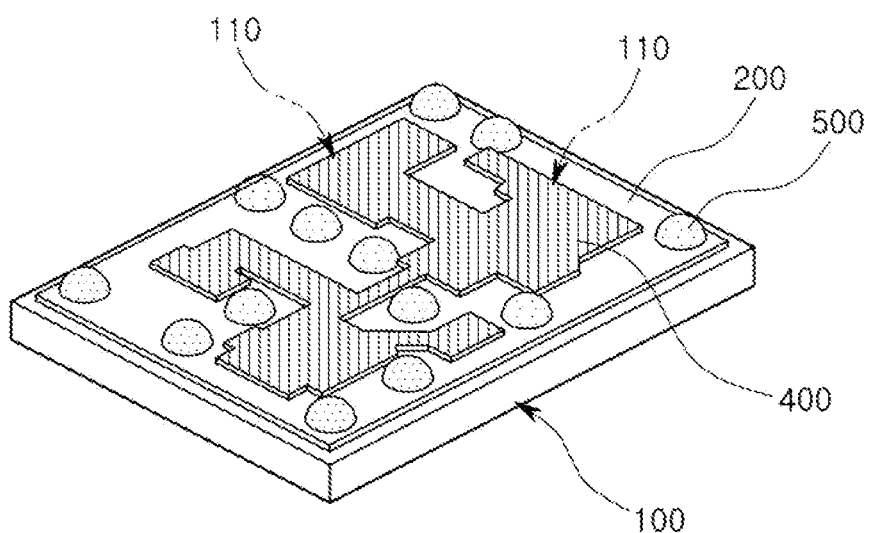
FIG. 19 is a perspective view schematically illustrating an acoustic wave device according to another exemplary embodiment in the present disclosure.

FIG. 19 is a perspective view schematically illustrating an acoustic wave device according to another exemplary embodiment in the present disclosure, and FIG. 20 is an exploded perspective view of the acoustic wave device illustrated in FIG. 19.

Referring to FIGS. 19 and 20, in the acoustic wave device according to the present exemplary embodiment, a plurality of acoustic wave generators 110 may be disposed on a single substrate 110.

A support component 200 may be formed in a single layer sheet form, and may include a plurality of holes H in which the acoustic wave generator 110 is disposed.

A protective member 300 may be formed in a single layer sheet form and stacked on the support component 200, and may close the holes H formed in the support component 200.

A sealing component 400 may be disposed on the protective member 300.

As described above, at least one of the protective member 300 and the sealing component 400 may be formed of a conductive material. Therefore, electromagnetic waves received at the acoustic wave generator 110 or emitted from the acoustic wave generator 110 may be easily blocked.

In the acoustic wave device according to the present exemplary embodiment as described above, a plurality of space portions (d in FIG. 2) in which the acoustic wave generator 110 is accommodated may be simultaneously formed by stacking a single layer support component 200 and a single layer protective member 300.

In the acoustic wave device according to the present disclosure described above, the protective member protecting the acoustic wave generator may serve as a shielding member blocking electromagnetic waves. Therefore, since there is no need to add a separate shielding member, the size of the acoustic wave device may be significantly decreased, and at the same time, the blocking effect against the electromagnetic waves may be improved.

As set forth above, according to exemplary embodiments in the present disclosure, in the acoustic wave device, the protective member or the sealing component protecting the acoustic wave generator may serve as the shielding member blocking the electromagnetic waves. Therefore, because there is no need to add a separate shielding member, the size of the acoustic wave device may be significantly decreased, and at the same time, the blocking effect against the electromagnetic waves may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave device, comprising:
a substrate comprising one surface on which an acoustic wave generator and at least one ground pad are included;
a support component formed of an insulating material and disposed on the substrate along a circumference of the acoustic wave generator;
a protective member formed of a conductive material and bonded to the support component so as to be spaced apart from the acoustic wave generator by a predetermined distance;
a connection conductor connecting the ground pad and the protective member to each other while penetrating through the support component; and
a sealing component formed on surfaces of the protective member, the support component, and the substrate to serve as a shielding member.

2. The acoustic wave device of claim 1, wherein the ground pad is formed on one surface of the substrate, disposed outside of the support component, and connected to the connection conductor through a wiring pattern formed on the substrate.

3. The acoustic wave device of claim 1, wherein a plurality of penetration components are formed in the protective member, the support component is disposed in each of the penetration components, and a connection terminal, connected to the acoustic wave generator, is disposed on a surface of the support component disposed in the penetration component.

4. The acoustic wave device of claim 1, wherein the ground pad is formed on one surface of the substrate, disposed outside of the support component, and connected to the sealing component.

5. The acoustic wave device of claim 1, further comprising:
a plurality of connection terminals disposed on at least one surface of the substrate and electrically connected to the acoustic wave generator.

6. The acoustic wave device of claim 1, further comprising:
an antenna formed on the substrate in a wiring pattern form,
wherein the acoustic wave device is a duplexer.

7. An acoustic wave device, comprising:
a substrate comprising one surface on which an acoustic wave generator and at least one ground pad are included;
a support component formed of an insulating material and disposed on the substrate along a circumference of the acoustic wave generator;
a protective member formed of an insulating material and bonded to the support component so as to be spaced apart from the acoustic wave generator by a predetermined distance, and to form a step portion at ends of the protective member on an upper surface of the support component;
a sealing component formed of a conductive material on surfaces of the protective member, the support component, the step portion, and the substrate; and
a connection conductor connecting the ground pad and the sealing component to each other while penetrating through the protective member and the support component.

8. The acoustic wave device of claim 7, wherein the sealing component comprises a plurality of bonding components disposed on the support component and a shielding film disposed on regions of the substrate, except for portions on which the bonding components are disposed, and
a connection terminal, electrically connected to the acoustic wave generator, is disposed on the bonding component.

9. The acoustic wave device of claim 8, further comprising:
a second sealing component formed of an insulating material and disposed on an outer portion of the shielding film.

10. A method of manufacturing an acoustic wave device, the method comprising:
preparing a substrate comprising one surface on which an acoustic wave generator and at least one ground pad are included;
forming, from an insulating material, a support component on the substrate along a circumference of the acoustic wave generator;
forming a protective member on the support component to be spaced apart from the acoustic wave generator by a predetermined distance;
forming a sealing component on surfaces of the support component, the protective member, and the substrate; and
forming at least one connection conductor connecting the protective member, which is formed of a conductive material, and the ground pad to each other in the support component.

11. The method of claim 10, wherein the forming of the sealing component further comprises:
electrically connecting the sealing component, which is formed of a conductive material, and the ground pad to each other.

12. The method of claim 10, wherein the forming of the sealing component further comprises:
forming a hole penetrating through the sealing component, which is formed of an insulating material, and the support component to expose the ground pad; and
forming a connection conductor in the hole using a conductive material.

13. An acoustic wave device, comprising:
a substrate comprising one surface on which an acoustic wave generator and at least one ground pad are included;
a support component formed of an insulating material and disposed on the substrate along a circumference of the acoustic wave generator;
a protective member formed of a conductive material and bonded to the support component so as to be spaced apart from the acoustic wave generator by a predetermined distance; and
a penetration component formed in the protective member, the support component is disposed in the penetration component, and a connection terminal, connected to the acoustic wave generator, is disposed on a surface of the support component disposed in the penetration component.

14. An acoustic wave device, comprising:
a substrate comprising one surface on which an acoustic wave generator and at least one ground pad are included;
a support component formed of an insulating material and disposed on the substrate along a circumference of the acoustic wave generator; and a protective member bonded to the support component so as to be spaced apart from the acoustic wave generator by a predetermined distance;

a sealing component formed on surfaces of the protective member, the support component, and the substrate to serve as a shielding member, wherein the ground pad is formed on one surface of the substrate, disposed outside of the support component, and connected to the sealing component.

15. An acoustic wave device, comprising:

a substrate comprising one surface on which an acoustic wave generator and at least one ground pad are included;

a support component formed of an insulating material and disposed on the substrate along a circumference of the acoustic wave generator;

a shielding member electrically connected to the ground pad and blocking reception or emission of electromagnetic waves at the acoustic wave generator; and an antenna formed on the substrate in a wiring pattern form, wherein the acoustic wave device is a duplexer.

16. A method of manufacturing an acoustic wave device, the method comprising:

preparing a substrate comprising one surface on which an acoustic wave generator and at least one ground pad are included;

forming, from an insulating material, a support component on the substrate along a circumference of the acoustic wave generator;

forming a protective member on the support component to be spaced apart from the acoustic wave generator by a predetermined distance;

forming a sealing component on surfaces of the support component, the protective member, and the substrate; and forming a hole penetrating through the sealing component, which is formed of an insulating material, and the support component to expose the ground pad; and forming a connection conductor in the hole using a conductive material.

* * * * *